(12) United States Patent
Yanagihara et al.

(10) Patent No.: US 8,704,207 B2
(45) Date of Patent: Apr. 22, 2014

(54) SEMICONDUCTOR DEVICE HAVING NITRIDE SEMICONDUCTOR LAYER

(75) Inventors: Masataka Yanagihara, Niiza (JP); Tetsuji Matsuo, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/492,151

(22) Filed: Jun. 8, 2012

(65) Prior Publication Data

US 2012/0326160 A1 Dec. 27, 2012

(30) Foreign Application Priority Data

Jun. 24, 2011 (JP) ................................. 2011-140256
Sep. 29, 2011 (JP) ................................. 2011-213733

(51) Int. Cl.
*H01L 29/12* (2006.01)

(52) U.S. Cl.
USPC .............. 257/12; 257/190; 257/191; 438/936

(58) Field of Classification Search
USPC ...................................... 257/12, 14, 190, 103
See application file for complete search history.

(56) References Cited

U.S. PATENT DOCUMENTS

| 5,923,690 | A | * | 7/1999 | Kume et al. | ............... | 372/46.014 |
| 6,455,870 | B1 | * | 9/2002 | Wang et al. | ..................... | 257/12 |
| 2011/0272665 | A1 | * | 11/2011 | Yamaguchi et al. | ............ | 257/12 |

FOREIGN PATENT DOCUMENTS

JP    2007-250721    9/2007

* cited by examiner

*Primary Examiner* — Ajay K Arora
(74) *Attorney, Agent, or Firm* — Oblon, Spivak, McClelland, Maier & Neustadt, L.L.P.

(57) ABSTRACT

A semiconductor device includes a silicon substrate, an aluminum nitride layer which is arranged on the silicon substrate and has a region where silicon is doped thereof as an impurity, a buffer layer which is arranged on the aluminum nitride layer and has a structure where a plurality of nitride semiconductor films are laminated, and a semiconductor functional layer which is arranged on the buffer layer and made of nitride semiconductor.

16 Claims, 8 Drawing Sheets

SEMICONDUCTOR DEVICE HAVING NITRIDE SEMICONDUCTOR LAYER

CROSS REFERENCE TO RELATED APPLICATIONS AND INCORPORATION BY REFERENCE

This application is based upon and claims the benefit of priority from prior Japanese Patent Application P2011-213733 filed on Sep. 29, 2011 and Japanese Patent Application P2011-140256 filed on Jun. 24, 2011; the entire contents of which are incorporated by reference herein.

BACKGROUND OF THE INVENTION

1. Field of the Invention

The present invention relates to a semiconductor device having a nitride semiconductor layer formed on a silicon substrate.

2. Description of the Related Art

Costs for high-voltage resistant nitride semiconductor elements are reduced by forming a nitride semiconductor layer on an inexpensive silicon substrate. However, there is a significant difference in the lattice constant between a silicon substrate and a nitride semiconductor layer. Also, a silicon substrate and a nitride semiconductor layer are different in coefficient of thermal expansion. Therefore, large strain energy is generated in a nitride semiconductor layer formed on a silicon substrate by epitaxial growth. As a result, cracks and deterioration of crystal quality could easily occur in the nitride semiconductor layer.

In order to avid such a problem, a buffer layer made of nitride semiconductor is arranged between a silicon substrate and a functional layer formed of nitride semiconductor. Also, a method for arranging an aluminum nitride layer between a silicon substrate and a buffer layer has been proposed.

However, it is difficult to form an aluminum nitride layer having good flatness directly on a silicon substrate. There have not been sufficient studies carried out on influences that flatness of an aluminum nitride layer formed on a silicon substrate has on reliability of a semiconductor device. Hence, there is a concern that reliability of a semiconductor could be decreased.

SUMMARY OF THE INVENTION

An aspect of the present invention is a semiconductor device. The semiconductor device includes a silicon substrate; an aluminum nitride layer which is arranged on the silicon substrate and has a region where silicon is doped thereof as an impurity; a buffer layer which is arranged on the aluminum nitride layer and has a structure where a plurality of nitride semiconductor films are laminated; and a semiconductor functional layer which is arranged on the buffer layer and made of nitride semiconductor.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details.

First Embodiment

Figure 1:
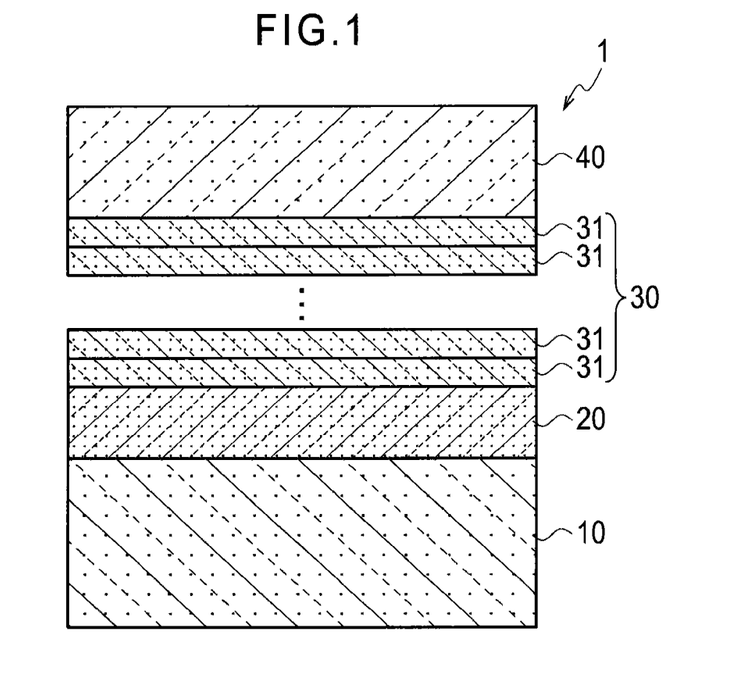
FIG. 1 is a schematic cross-sectional view showing a structure of a semiconductor device according to a first embodiment of the present invention.

As illustrated in FIG. 1, a semiconductor device 1 according to the first embodiment of the present invention is provided with a silicon substrate 10, an aluminum nitride layer (hereinafter referred to as a Si-doped AlN layer) 20 in which silicon is doped as an impurity and which is arranged on and in an adjacent to the silicon substrate, a buffer layer 30 which is arranged on the Si-doped AlN layer 20 and has a structure in which a plurality of nitride semiconductor layers 31 are laminated, and a semiconductor functional layer 40 arranged on the buffer layer 30 and made of nitride semiconductor.

The buffer layer 30 has a structure in which a multilayered film made of a plurality of $Al_xGa_{1-x}N$ ($0</=X</=1$) films having different compositions from each other and arranged next to each other is stacked cyclically. Each of the nitride semiconductor layers 31 is, for example, non-doped $Al_xGa_{1-x}N$ film, but an impurity may be doped therein. Here, "non-doped" means that no impurities are added purposely. Note that there is no particular limit on the number of lamination cycles and thickness of the nitride semiconductor layers 31 which configure the buffer layer 30.

Figure 2A:
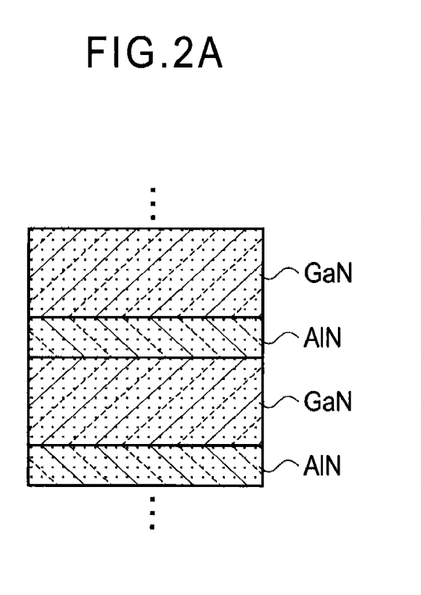
FIGS. 2A and 2B are schematic cross-sectional views showing a structure of a buffer layer of the semiconductor device according to the first embodiment of the present invention.

For example, the buffer layer 30 may adopt a structure in which an $Al_{X1}Ga_{1-X1}N$ film and an $Al_{X2}Ga_{1-X2}N$ film are laminated alternately ($0</=X2<1$, $X2<X1</=1$). More specifically, as illustrated in FIG. 2A, for example, an AlN film with a thickness of approximately 5 nm and a GaN film with a thickness of approximately 20 nm can be laminated alternately to form the buffer layer 30.

Figure 2B:
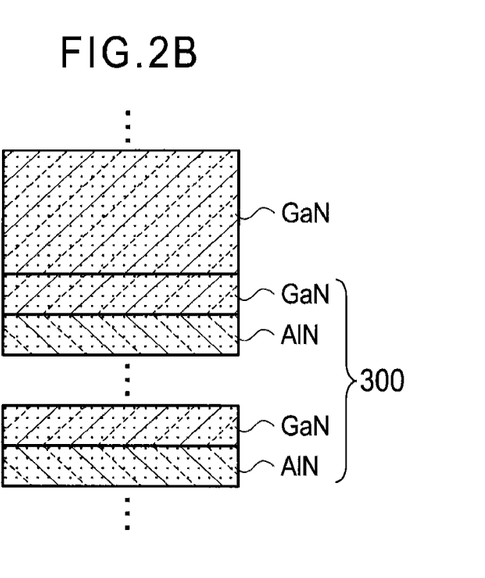

Alternatively, the buffer layer 30 may have a structure in which an AlGaN film is arranged on a laminated body where pairs of $Al_{X1}Ga_{1-X1}N$ film and $Al_{X2}Ga_{1-X2}N$ film are laminated. For example, as shown in FIG. 2B, the buffer layer 30 may be formed in the following manner. That is, a GaN film is arranged on a laminated body 300 where approximately 10 pairs of an AlN film and a GaN film are alternately laminated, thus forming a laminated structure, and this laminated structure is cyclically repeated. The film thicknesses of the AlN film and the GaN film are approximately 5 nm, and the GaN film arranged on the laminated body 300 is approximately 200 nm. By adopting the laminated structure shown in FIG. 2B, the film thickness of the buffer layer 30 can be made thicker.

It is preferred that the nitride semiconductor layer formed on the silicon substrate 10 and composed of the Si-doped AlN layer 20, the buffer layer 30, and the semiconductor functional layer 40 have the overall thickness of approximately 5 μm. This is to make the semiconductor device 1 into a high-voltage resistant device with resistance to a voltage of 300V or higher, for example.

Next, a film thickness of the Si-doped AlN layer 20 will be explained.

Since a nitride semiconductor layer is grown under a high temperature of 1000 degrees centigrade or higher, it is required to conduct high-temperature thermal treatment for a long period of time in order to grow a thick nitride semiconductor film. By this thermal treatment, gallium (Ga) atoms from the buffer layer 30 are diffused into the Si-doped AlN layer 20 when forming the buffer layer 30 and the semiconductor functional layer 40. Therefore, by conducting the thermal treatment for along time, Ga atoms diffused into the Si-doped AlN layer 20 reach the silicon substrate 10, and meltback occurs which is a reaction between Ga atoms and Si atoms in the silicon substrate.

By increasing the thickness of the Si-doped AlN layer 20, the film thickness of the nitride semiconductor layer can be increased without causing meltback. Having said that, due to an increase in the film thickness, cracks are more likely to occur in the nitride semiconductor layer. Therefore, it is preferred that the film thickness of the Si-doped AlN layer 20 be approximately 300 nm or less.

On the other hand, in order to form the nitride semiconductor layer with the film thickness of approximately 5 μm without causing meltback, the film thickness of the Si-doped AlN layer 20 needs to be several tens nm or so.

Therefore, in order to realize the high-voltage resistant semiconductor device 1, it is preferred that the Si-doped AlN layer 20 have the film thickness of approximately 20 nm to 300 nm. Further, in order to inhibit occurrence of meltback and cracks more reliably, it is preferred that the film thickness of the Si-doped AlN layer 20 be approximately 100 nm to 150 nm. An electrical field applied to the Si-doped AlN layer 20 is lower than that applied to a non Si-doped AlN layer. Therefore, it is not necessary to consider a limit of the film thickness of the Si-doped AlN layer 20 as far as the electrical field is concerned.

Conventionally, in order to form the functional layer made of nitride semiconductor with good crystalline and flatness by using the silicon substrate, a buffer layer has been arranged between a silicon substrate and a functional layer. By combining a plurality of AlGaN films having different Al compositions from each other and setting an appropriate film thickness for each of the films, a buffer layer having a flat surface can be realized with which a semiconductor device made of nitride semiconductor such as a high electron mobility transistor (HEMT) or a Schottky barrier diode (SBD) can be formed.

Figure 3:
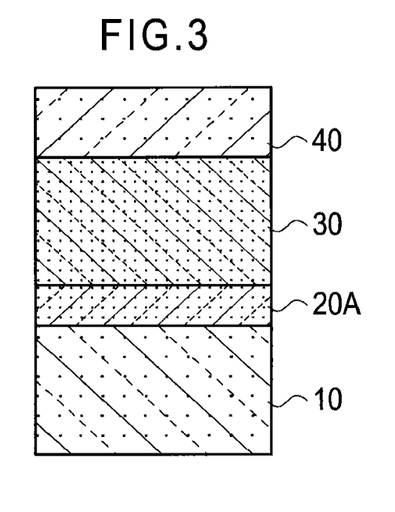
FIG. 3 is a schematic cross-sectional view showing a structure of a semiconductor device according to a comparative example.

For example, like a comparative example shown in FIG. 3, an AlN layer 20A is arranged on a silicon substrate 10, and a buffer layer 30 and a semiconductor functional layer 40 are arranged on the AlN layer 20A, thus forming a semiconductor device. By increasing the film thickness of the buffer layer 30 by elaborating the configuration of the buffer layer 30, breakdown voltage of semiconductor devices have been improved dramatically.

For high-voltage power switching elements, reduction in leak current and improvement of breakdown voltage are required. One way to achieve them is increasing a film thickness of the AlN layer 20A.

However, the present inventors have gained a new insight that, when the film thickness of the AlN layer 20A is increased, there is a problem that reliability of the semiconductor device is decreased even if the initial properties thereof are good. The present inventors have found that the reliability degradation is significantly affected by the surface flatness of the AlN layer 20A which is first formed on the silicon substrate.

It is difficult to grow a flat AlN layer which is first formed on a silicon substrate because of a difference in lattice coefficient between Si and nitride semiconductor. Generally, the properties of a semiconductor device are deteriorated when there are pits on the surface of the functional layer of the semiconductor device. Therefore, efforts have been made to form a flat nitride semiconductor layer on a silicon substrate.

Figure 4:
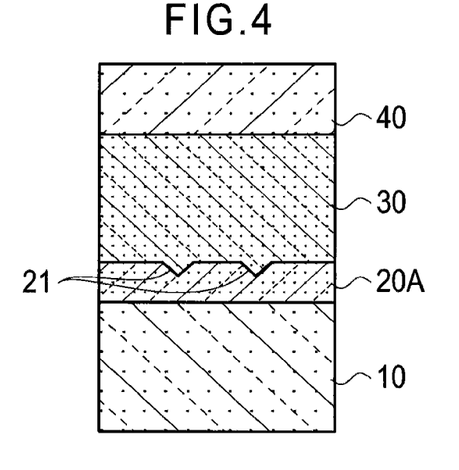
FIG. 4 is a schematic cross-sectional view showing an example of poor flatness of an AlN film in the semiconductor device according to the comparative example.

However, flatness of an AlN layer which is first formed on a silicon substrate has not been regarded as important. This is because, as shown in FIG. 4, even if the AlN layer 20A does not have good flatness due to pits 21 formed on the surface thereof, the surface where the semiconductor functional layer 40 is formed can be made flat by the buffer layer 30 formed on the AlN layer 20A. In addition, it has been considered that, even if the AlN layer 20A does not have good flatness, a breakdown voltage can be improved by forming the thick AlN layer 20A.

However, a high electrical field is applied to the AlN layer 20A due to the insulation properties thereof. Also, when the AlN layer 20A has poor flatness, an electrical field further concentrates on thin areas.

For example, consider the case where the AlN layer 20A has a flat area with a film thickness of 250 nm, as well as partial areas with a film thickness of 200 nm. When a voltage of 60V is applied to the AlN layer 20A, an electrical field applied to the thick area is approximately $2.4 \times 10^6$ V/cm, whereas an electrical field applied to the thin areas is approximately $3 \times 10^6$ V/cm. Here, the buffer layer 30 on the AlN layer 20A has lower resistance than the AlN layer 20A, so it is considered that voltage is evenly applied to the AlN layer 20A. At this time, the electrical field applied to the buffer layer 30 and the semiconductor functional layer 40 is approximately $1 \times 10^6$ V/cm.

The dielectric breakdown electric field of a GaN film is approximately $4 \times 10^6$ V/cm, and the dielectric breakdown electric field of an AlN film is approximately $2 \sim 11.7 \times 10^6$ V/cm. Therefore, the electrical field applied to the buffer layer 30 and the semiconductor functional layer 40 is about one fourth of the dielectric breakdown electric field.

Meanwhile, it is considered that an electric field applied to the AlN layer 20A on the silicon substrate 10 is about one fourth of the dielectric breakdown electric field, which is $11.7 \times 10^6$ V/cm. However, the AlN layer 20A in reality is a film with a high defect density, and the dielectric breakdown electric field of the AlN layer 20A is expected to be lower than $11.7 \times 10^6$ V/cm. Therefore, it is assumed that an electric field close to the dielectric breakdown electric field is applied to the AlN layer 20A.

Since an electrical field concentrates on the thin areas of the AlN layer 20A, a leak current concentrates on the thin areas. This is because a hetero interface is formed between nitride semiconductor films which construct the buffer layer 30 and have different compositions from each other, and the buffer layer 30 has conductivity to an extent that carries generated in the hetero interface can travel in parallel to the interface. As a leak current concentrates on the areas where an electrical field close to the dielectric breakdown electric field is applied, degradation of the AlN layer 20A progresses, and the semiconductor is broken in a short period of time, which means the reliability thereof is low.

Therefore, it is desired to form an AlN layer 20A having high flatness where there is no partial concentration of leak current. However, in addition to the fact that the silicon substrate 10 and the AlN layer 20A have a difference in lattice constant, a size of devices is becoming larger to several square millimeters along with reduced on-resistance. Hence, it is difficult to form a flat AlN layer 20A throughout such a large region.

Meanwhile, according to the semiconductor 1 shown in FIG. 1, forming the Si-doped AlN layer 20 on the silicon substrate 10 enables to prevent the semiconductor device 1 from being broken in a short period of time because of partial concentration of a leak current flow.

As stated previously, when the non Si-doped AlN layer 20A is used, a leak current flow concentrates on partial areas where a high electrical field is applied. On the contrary, in the semiconductor 1, an electrical field applied to the Si-doped AlN layer 20 is moderated compared to the AlN layer 20A in which Si is not doped. Thus, there is no concentration of a leak current flow on specific areas, preventing breakage of the Si-doped AlN layer 20 in a short amount of time. As a result, although a breakdown voltage is reduced, the lifetime of the semiconductor device 1 is improved.

The preferred doping concentration of Si in the Si-doped AlN layer 20 is approximately between $1 \times 10^{18}$ and $1 \times 10^{21}$ cm$^{-3}$. If the doping concentration of silicon is too low, an electrical field applied to the Si-doped AlN layer 20 will not be moderated sufficiently. On the contrary, if the doping concentration of silicon is too high, the crystal quality of the Si-doped AlN layer 20 will be deteriorated. The concentration of Si in the Si-doped AlN layer 20 may have a given distribution in accordance with properties required for the semiconductor device 1.

Figure 5:
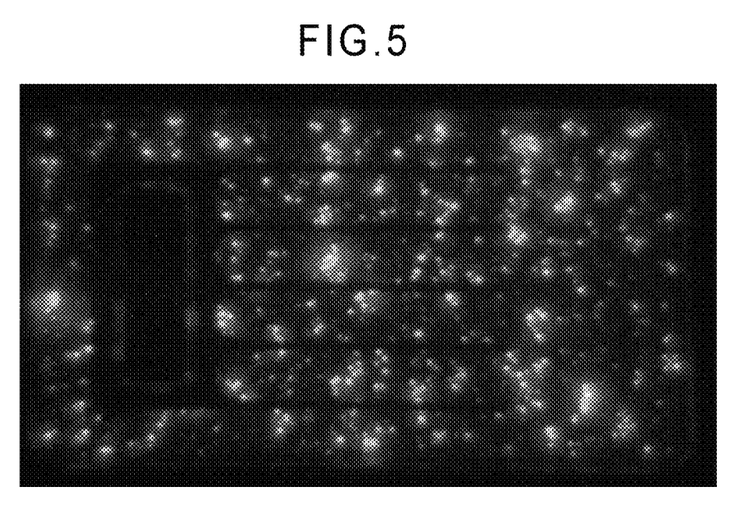
FIG. 5 is a photograph showing a state of a surface of a semiconductor functional layer in a case where a voltage is applied to the semiconductor device according to the comparative example.

FIG. 5 shows a light-emitting state in a case where a titanium aluminum (TiAl) electrode is formed on the semiconductor functional layer 40 of the semiconductor device using the non Si-doped AlN layer 20A and a voltage is applied between the TiAl electrode and the silicon substrate 10. As seen in FIG. 5, when the non Si-doped AlN layer 20A is used, there are a number of light dots that exist locally, proving that leak current flows are concentrated in several areas. FIG. 5 is a photograph which observes the surface of the semiconductor functional layer 40. The voltage applied between the TiAl electrode and the silicon substrate 10 is 600V, and the current flowing between the TiAl electrode and the silicon substrate 10 is 100 μA.

Figure 6:
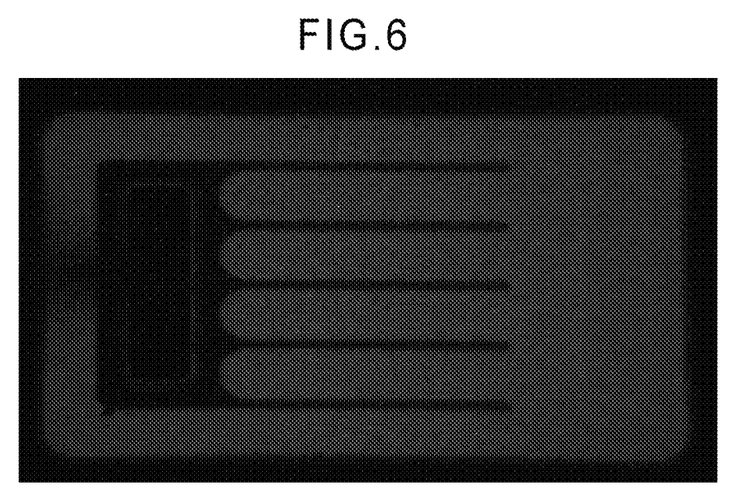
FIG. 6 is a photograph showing a state of a surface of a semiconductor functional layer in a case where a voltage is applied to the semiconductor device according to the first embodiment of the present invention.

Meanwhile, FIG. 6 shows an example of a light-emitting state in a case where a TiAl electrode is formed on the semiconductor functional layer 40 of the semiconductor device 1 according to the first embodiment of the present invention, and a voltage is applied between the TiAl electrode and the silicon substrate 10. FIG. 6 is a photograph which observes the surface of the semiconductor functional layer 40. The voltage applied between the TiAl electrode and the silicon substrate 10 is 600V. The doping concentration of Si in the Si-doped AlN layer 20 is $1 \times 10^{19}$ cm$^{-3}$.

As shown in FIG. 6, when the Si-doped AlN layer 20 is used, there are no light dots observed on the surface of the semiconductor functional layer 40. This proves that there is no local concentration of a leak current flow in the semiconductor device 1 which uses the Si-doped AlN layer 20. Note that FIGS. 5 and 6 show examples where the semiconductor functional layers 40 have a HEMT structure in which an AlGaN layer and a GaN layer are laminated.

As explained above, by arranging the Si-doped AlN layer 20 between the silicon substrate 10 and the buffer layer 30, local concentration of a leak current flow can be prevented, enabling to improve the lifetime of the semiconductor device 1.

The semiconductor device 1 with desired functions can be realized by preparing a semiconductor wafer having a structure in which the Si-doped AlN layer 20 and the buffer layer 30 are formed on the silicon substrate 10, and forming a predetermined semiconductor functional layer 40 on the buffer layer 30. Examples of the semiconductor device 1 are HEMT, SBD, and so on.

Figure 7:
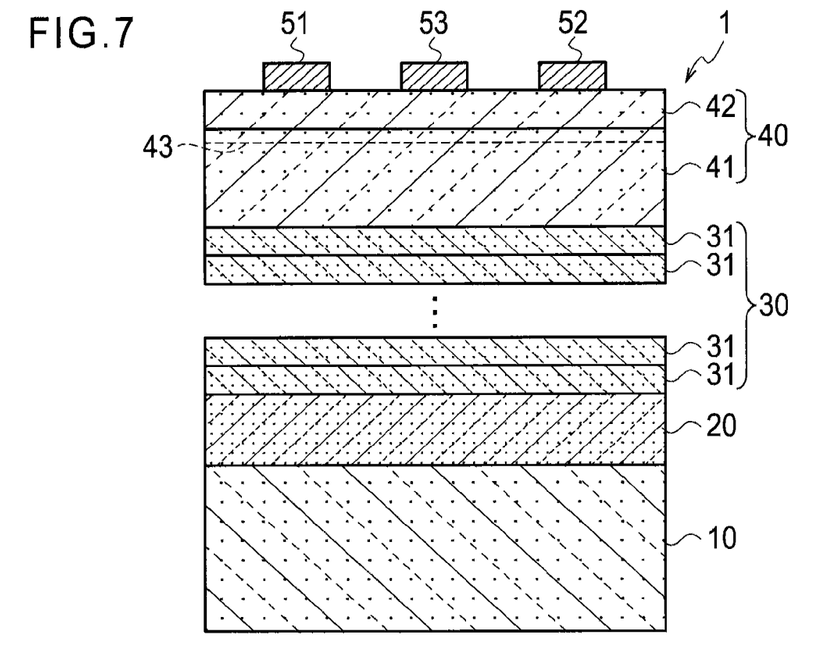
FIG. 7 is a schematic view showing a structure of the semiconductor device according to the first embodiment of the present invention when the semiconductor device is a HEMT.

In a case where the semiconductor device 1 is a HEMT, the semiconductor device 1 is structured as illustrated in FIG. 7. In other words, the semiconductor functional layer 40 is structured by a carrier travel layer 41 and a carrier supply layer 42. In addition, a source electrode 51, and a drain electrode 52 are arranged away from each other on the semiconductor functional layer 40, and a gate electrode 53 is located between the source electrode 51 and the drain electrode 52. In the semiconductor device 1 illustrated in FIG. 7, a two-dimensional carrier gas layer 43 serving as a current path (channel) is formed in the carrier travel layer 41 in the vicinity of the hetero-junction surface between the carrier travel layer 41 and the carrier supply layer 42.

The carrier travel layer 41 is formed by, for example, growing non-doped or impurity-doped GaN to a thickness of approximately 2000 nm by epitaxial growth using a metal organic chemical vapor deposition (MOCVD) method or the like.

The carrier supply layer 42 has a larger bandgap than the carrier travel layer 41, and is made of nitride semiconductor having different lattice constant from the carrier travel layer 41. The carrier supply layer 42 is, for example, a nitride semiconductor body expressed as $Al_xGa_yM_{1-x-y}N$ ($0 \le x < 1$, $0 \le y < 1$, $0 \le x+y \le 1$, where M represents indium (In) or boron (B) and so on). Non-doped $Al_xGa_{1-x}N$ can also be used as the carrier supply layer 42. Further, a nitride semiconductor body made of $Al_xGa_{1-x}N$ in which an n-type impurity or a p-type impurity is added can also be used as the carrier supply layer 42. Furthermore, the carrier travel layer 41 and the carrier supply layer 42 can have a same lattice constant. The film thickness of the carrier supply layer 42 is approximately 10 to 50 nm, or about 20 nm for example. The source electrode 51, the drain electrode 52, and the gate electrode 53 are arranged on the carrier supply layer 42.

Figure 8:
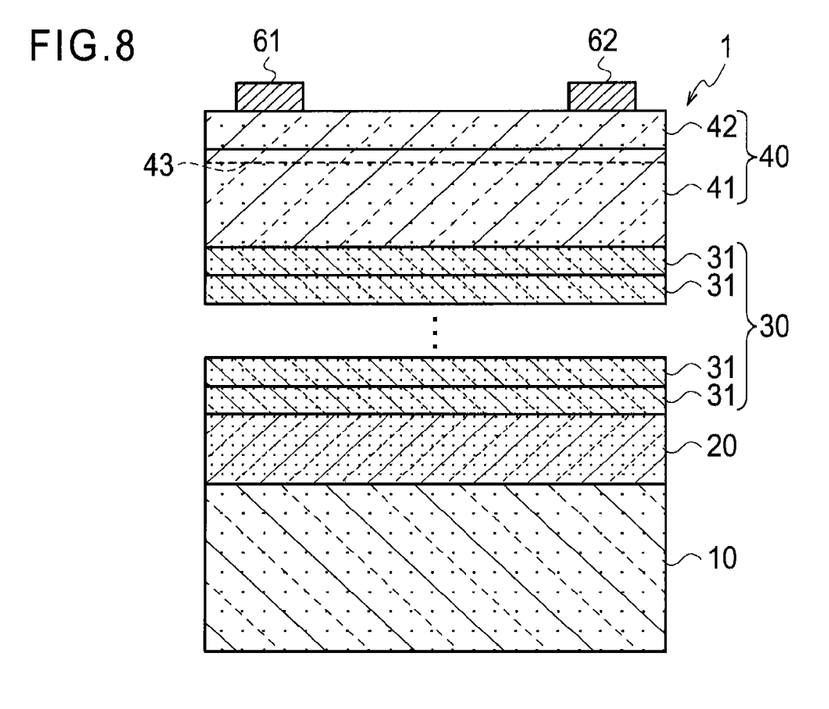
FIG. 8 is a schematic view showing a structure of the semiconductor device according to the first embodiment of the present invention when the semiconductor device is a SBD.

In order to realize a SBD by using the semiconductor device 1, a structure illustrated in FIG. 8 may be adopted. Similarly to the case of a HEMT, the semiconductor functional layer 40 is configured by, for example, a carrier travel layer 41 made of a GaN film and a carrier supply layer 42 made of an AlGa film. Then, an anode electrode 61 and a cathode electrode 62 are arranged away from each other on the semiconductor functional layer 40. A Schottky junction is formed between the anode electrode 61 and the carrier supply layer 42, and an ohmic contact is formed between the cathode electrode 62 and the carrier supply layer 42. In the semiconductor device 1 shown in FIG. 8, a current flows between the anode electrode 61 and the cathode electrode 62 through a two-dimensional carrier gas layer 43.

As explained so far, in the semiconductor device 1 according to the first embodiment of the present invention, local concentration of leak current flows due to poor flatness of the Si-doped AlN layer 20 can be inhibited by arranging the Si-doped AlN layer 20 between the silicon substrate 10 and the buffer layer 30. Therefore, according to the semiconductor device 1, the degradation of reliability thereof due to poor flatness of a nitride semiconductor layer formed directly on the silicon substrate is inhibited, thus enabling to provide a semiconductor device with improved lifetime.

The semiconductor device 1 according to the first embodiment of the present invention can be employed for a HEMT, a SBD, and so on as a high-voltage resistant semiconductor device which is resistant to 300V or higher.

Second Embodiment

Figure 9:
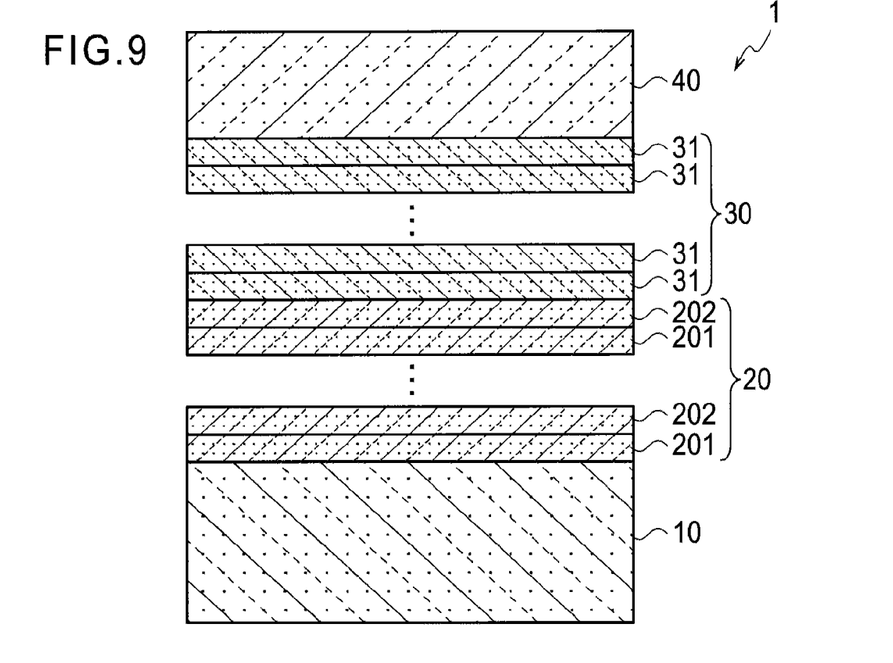
FIG. 9 is a schematic cross-sectional view showing a structure of a semiconductor device according to a second embodiment of the present invention.

As shown in FIG. 9, in a semiconductor device 1 according to the second embodiment of the present invention, a Si-doped AlN layer 20 includes first aluminum nitride (AlN) regions 201 where silicon is doped with a first doping concentration, and second aluminum nitride (AlN) regions 202 where silicon is doped with a second doping concentration which is lower than the first doping concentration. In other words, a difference from the semiconductor device 1 shown in FIG. 1 is that the Si-doped AlN layer 20 has a structure in which a plurality of regions having different Si doping concentrations are laminated. The rest of the constitution thereof is the same as the first embodiment.

The silicon doping concentration in the first AlN regions 201 is, for example, $1 \times 10^{18}$ cm$^{-3}$ or higher but not exceeding $1 \times 10^{21}$ cm$^{-3}$. Meanwhile, the silicon doping concentration in the second AlN regions 202 is, for example, $1 \times 10^{17}$ cm$^{-3}$ or lower. Having said that, any silicon doping concentration may be used as long as the silicon doping concentration of the first AlN regions 201 is higher than that of the second AlN regions 202. For example, when the silicon doping concentration of the first AlN regions 201 is $1 \times 10^{21}$ cm$^{-3}$, the silicon doping concentration of the second AlN regions 202 is $1 \times 10^{19}$ cm$^{-3}$. Or, Si may not be doped in the second AlN regions 202.

The example illustrated in FIG. 9 shows a structure of the Si-doped AlN layer 20 in which the plurality of first AlN regions 201 and the plurality of second AlN regions 202 are laminated alternately. The number of laminations is set so that the overall film thickness of the laminated body of the first AlN regions 201 and the second AlN regions 202 does not exceed a predetermined value. As explained earlier, it is preferred that the film thickness of the Si-doped AlN layer 20 be 20 nm or larger but not exceeding 300 nm. The Si-doped AlN layer 20 may also be constituted by one layer of, respectively, the first AlN region 201 and the second AlN region 202.

As Si is doped, the crystal of the Si-doped AlN layer 20 is hardened. Therefore, cracks and pits are more likely to occur, thus deteriorating the crystal quality of the Si-doped AlN layer 20. By adopting the structure shown in FIG. 9 where the first AlN regions 201 and the second AlN regions 202 are laminated, the deteriorated crystal quality within the first AlN regions 201 is improved within the second AlN regions 202. Thus, compared to the case where Si is doped in the Si-doped AlN layer 20 evenly in the film thickness direction, the Si-doped AlN layer 20 in the semiconductor device 1 illustrated in FIG. 9 has better crystal quality. This means the crystal quality of the buffer layer 30 and the semiconductor functional layer 40 is improved. As a result, the semiconductor device 1 having properties with better motility and so on is obtained.

In the example shown in FIG. 9, the first AlN region 201 is arranged in proximity to the silicon substrate 10, and the second AlN region 202 is arranged in proximity to the buffer layer 30. As the Si concentration increases, the crystal quality of the AlN layer is decreased, but the moderating effect on electrical field is increased. Therefore, in the semiconductor device 1 shown in FIG. 9, although the crystal quality of the first AlN region 201 in the vicinity of the silicon substrate 10 is low, the crystal quality of the Si-doped AlN layer 20 is improved by growing the second AlN region 202 in the vicinity of the buffer layer 30. At this time, by forming the first AlN region 201, an electrical field generated in the Si-doped AlN layer 20 is moderated, and reliability for breakdown voltage of the semiconductor device 1 is improved.

Figure 10:
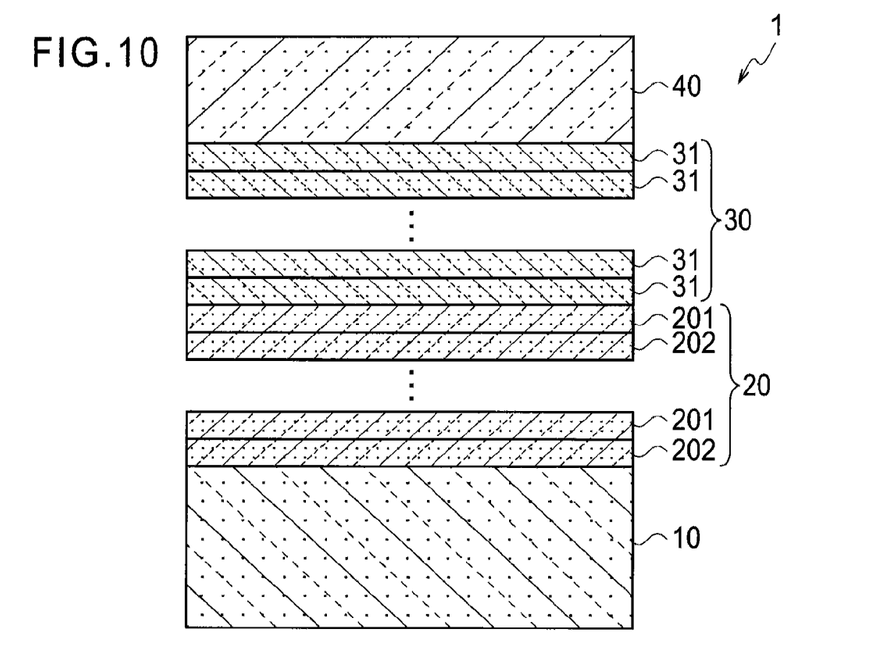
FIG. 10 is a schematic cross-sectional view showing another structure of the semiconductor device according to the second embodiment of the preset invention.

On the other hand, as illustrated in FIG. 10, the second AlN region 202 may be arranged in proximity to the silicon substrate 10 and the first AlN region 201 may be arranged in proximity to the buffer layer 30. When the structure shown in FIG. 10 is employed, the interface between silicon substrate 10 and the second AlN region 202 has good crystal quality, enabling to form the first AlN region 201 on the second AlN region 202 with a relatively good crystal quality.

Figure 11:
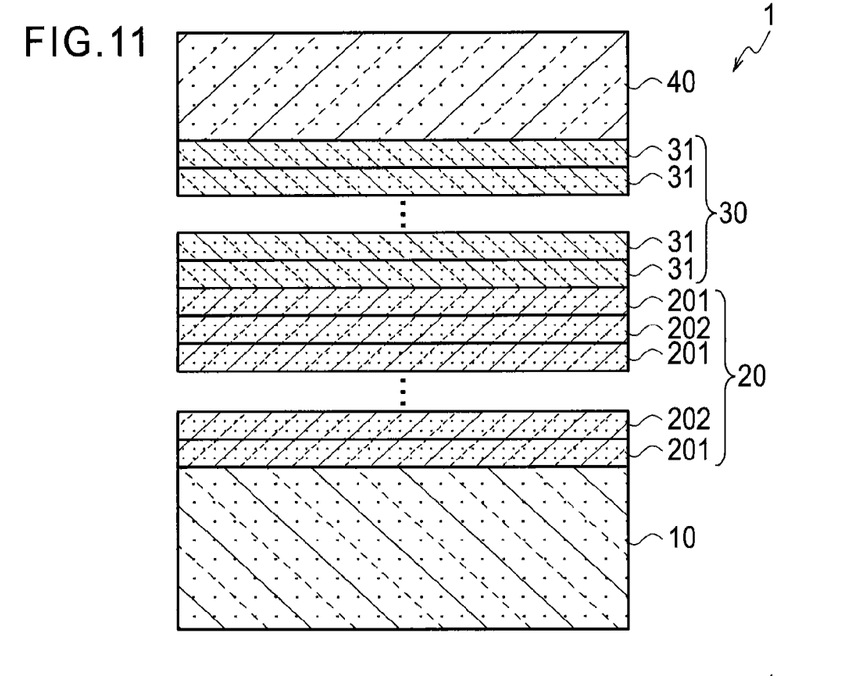
FIG. 11 is a schematic cross-sectional view showing a still another structure of the semiconductor device according to the second embodiment of the present invention.

As depicted in FIG. 11, the first AlN regions 201 may be arranged in the vicinities of the silicon substrate 10 and the buffer layer 30, respectively. By adopting the structure shown in FIG. 11, the second AlN regions 202 which has a low Si concentration and high resistivity is provided within the Si-doped AlN layer 20, and, at the same time, the interface between the Si-doped AlN layer 20 and the silicon substrate 10 and the interface between the Si-doped AlN layer 20 and the buffer layer 30 are formed by the first AlN regions 201 which have a high Si concentration. As a result, concentration of electrical fields on pit areas in the interfaces can be effectively alleviated.

Figure 12:
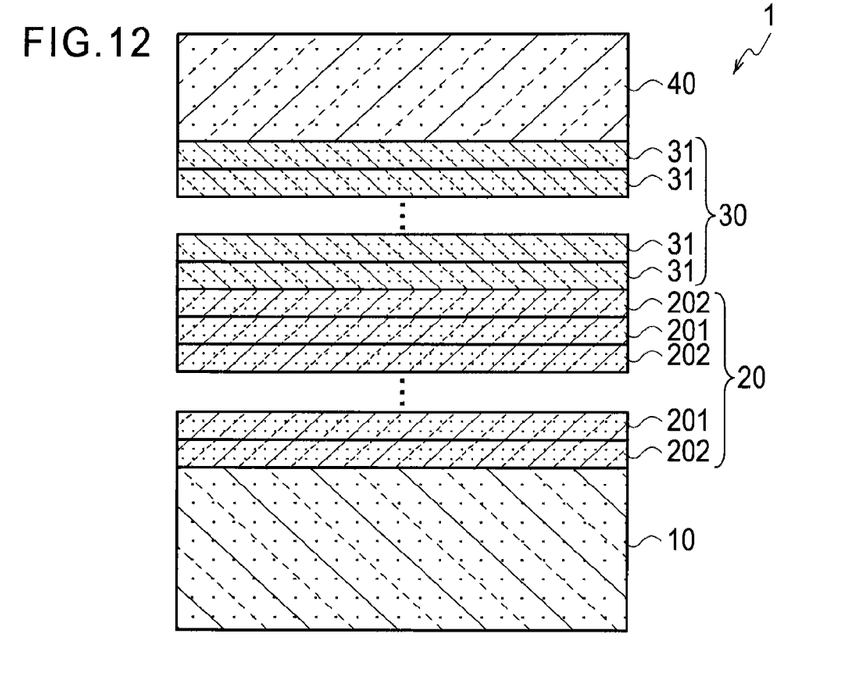
FIG. 12 is a schematic cross-sectional view showing a still another structure of the semiconductor device according to the second embodiment of the present invention.

Also, as shown in FIG. 12, the second AlN regions 202 may be arranged in the vicinities of the silicon substrate 10 and the buffer layer 30, respectively. By adopting the structure shown in FIG. 12, the decreased crystal quality within the first AlN region 201 can be improved within the second AlN region 202 in the vicinity of the buffer layer 30.

When there is the plurality of first AlN regions in the Si-doped AlN layer 20, each of the first AlN regions 201 may have a same Si doping concentration or different Si doping concentrations from each other. Further, when there is the plurality of second AlN regions 202 in the Si-doped AlN layer 20, each of the second AlN regions 202 may have a same Si doping concentration or different Si doping concentrations from each other. This means that any Si doping concentration can be adopted as long as regions with higher Si concentrations and lower Si concentrations are arranged alternately in the Si-doped AlN layer 20.

The second AlN region 202 having a low Si concentration, itself has low conductivity. Therefore, it is preferred that the second AlN region 202 be designed to have a small film thickness. For example, the film thickness of the second AlN region 202 is designed to be 10 nm or smaller. In this case, due to the carrier tunneling effect, carriers can easily move in the second AlN region 202 in the film thickness direction thereof. As a result, the Si-doped AlN layer 20 can be realized which has good conductivity to the extent that breakage is not caused due to electric field concentration.

Further, by designing the first AlN regions 201 and the second AlN regions 202 to have the film thicknesses of approximately 2 nm to 5 nm, respectively, the Si-doped AlN layer 20 having good conductivity can be realized due to carrier tunneling effect. In other words, the semiconductor device 1 can be realized which has good conductivity even if a doped quantity of Si is reduced, as well as improved crystal quality due to the reduced quantity of Si doping.

When a doped quantity of an impurity (Si) is small (or no impurity is doped) in the AlN region which is first grown on the silicon substrate 10, the crystal quality and flatness thereof are improved in the initial stage of growth. This affects all films laminated thereafter, which leads to an improvement of properties of the semiconductor device 1. The same effect can be obtained by forming a region with a small doped quantity of an impurity (Si) (or non-doped region) in the middle of the Si-doped AlN layer 20.

In the semiconductor device 1 according to the second embodiment of the present invention, the Si concentration in the Si-doped AlN layer 20 changes in the film thickness direction. Because of this, the properties and reliability of the semiconductor device 1 can be improved compared to the case where Si is doped evenly in the film thickness direction. In other words, by forming at least one region with a small quantity of Si doping or non-doped region in the Si-doped AlN layer 20 in the film thickness direction, the crystal quality of the entire Si-doped AlN layer 20 can be improved. Moreover, the region with a large quantity of Si doping modifies electric fields generated in the Si-doped AlN layer 20. As a result, the initial properties of the semiconductor device 1 are improved, and, at the same time, the reliability for breakdown voltage of the same can be improved. The rest of the configuration is substantially the same as the first embodiment, and the explanation thereof is omitted to avoid duplication.

The silicon substrate 10 is set in a chemical vapor deposition (CVD) system, and the Si-doped AlN layer 20 can be formed on the silicon substrate 10 while appropriately adjusting the respective vapor phase supplies of trimethyl gallium (TMG), ammonia ($NH_3$), monosilane ($SiH_4$), and dichlorosilane ($SiH_2Cl_2$). By conducting switching of the flow volume of ammonia ($NH_3$), switching of the growth temperature, switching between pulsed growth and continuous growth, and so on, the first AlN regions 201 and the second AlN regions 202 having different Si concentrations can be laminated alternately. "Pulsed growth" means a growing method where an Al raw material (for example, TMA) and a nitrogen source (for example, ammonia) are supplied intermittently.

When the doping quantity of an impurity (Si) is large in the AlN layer which is first formed on the silicon substrate 10, "three dimensional growth" happens on the surface of the silicon substrate 10 where island-shaped AlN films are grown. However, the crystal quality of the Si-doped AlN layer 20 can be improved by utilizing these three-dimensionally grown AlN films. By growing the AlN film on the three-dimensionally grown AlN film under the film deposition conditions which readily cause lateral growth, an effect of reducing dislocation density using lateral growth can be acquired. At the same time, an effect of moderating distortion generated by forming a nitride semiconductor layer on the silicon substrate 10 by epitaxial growth can be acquired. The film deposition conditions which readily cause lateral growth include reduction in doped quantity of an impurity (or no doping), increase in film deposition temperature, an increase in ratio of hydrogen gas, and intermittent supply of an Al raw material and a nitrogen source.

MODIFIED EXAMPLES

Figure 13:
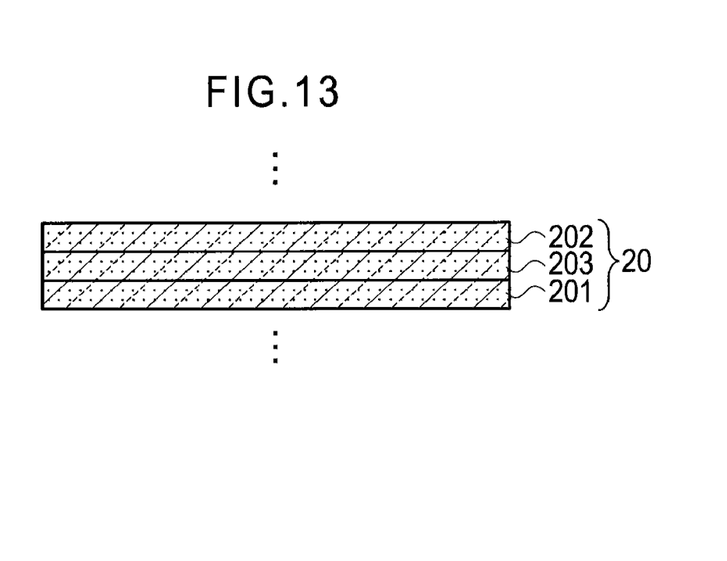
FIG. 13 is a schematic cross-sectional view showing a structure of a semiconductor device according to a modification of the second embodiment of the present invention.

As illustrated in FIG. 13, the Si-doped AlN layer 20 may have a structure where an intermediate aluminum nitride (AlN) region 203 is provided between the first AlN region 201 and the second AlN region 202. In the intermediate AlN region 203, silicon is doped with an intermediate concentration which is lower than the Si concentration in the first AlN region 201 and higher than the Si concentration of the second AlN region 202.

When there is no intermediate AlN region 203, and the first AlN regions 201 and the second AlN regions 202 are arranged alternately, crystal distortion is alleviated only in the interface between the first AlN region 201 and the second AlN region 202. Meanwhile, by adopting the structure shown in FIG. 13, crystal distortions are alleviated in the interface between the first ALN region 201 and the intermediate AlN region 203 and the interface between the second AlN region 202 and the intermediate AlN region 203, respectively. In other words, as there are more regions where distortions are alleviated, the reliability of the semiconductor device 1 is improved.

Also, there may be the plurality of intermediate AlN regions 203 arranged between the first AlN region 201 and the second AlN region 202. By arranging the plurality of intermediate AlN regions 203 having different Si concentrations between the first AlN region 201 and the second AlN region 202 so that the Si concentration gradually changes in the film thickness direction, the change in Si concentration in the Si-doped AlN layer 20 becomes moderate. Hardness and crystal distortion of an AlN film depends on the doped quantity of Si. Therefore, by moderating the change in Si concentration by forming the intermediate AlN regions 203, distortions between neighboring regions having different Si concentrations in the Si-doped AlN layer 20 are alleviated, thus suppressing occurrence of cracks.

Alternatively, the Si concentration in the Si-doped AlN layer 20 can be changed continuously in the film thickness direction. For example, in a Si-doped AlN layer 20 shown in FIG. 14, the Si concentration is gradually changed along the film thickness direction so that the Si concentration of a region 210 in the vicinity of the silicon substrate 10 is high and the Si concentration of a region 220 in the vicinity of the buffer layer 30 is low. For example, a Si concentration of the region 210 having a high Si concentration is set to be approximately $1\times10^{18}$ cm$^{-3}$ to $1\times10^{21}$ cm$^{-3}$, and a Si concentration of the region 220 having a low Si concentration is set to be approximately $1\times10^{17}$ cm$^{-3}$ or lower.

Figure 14:
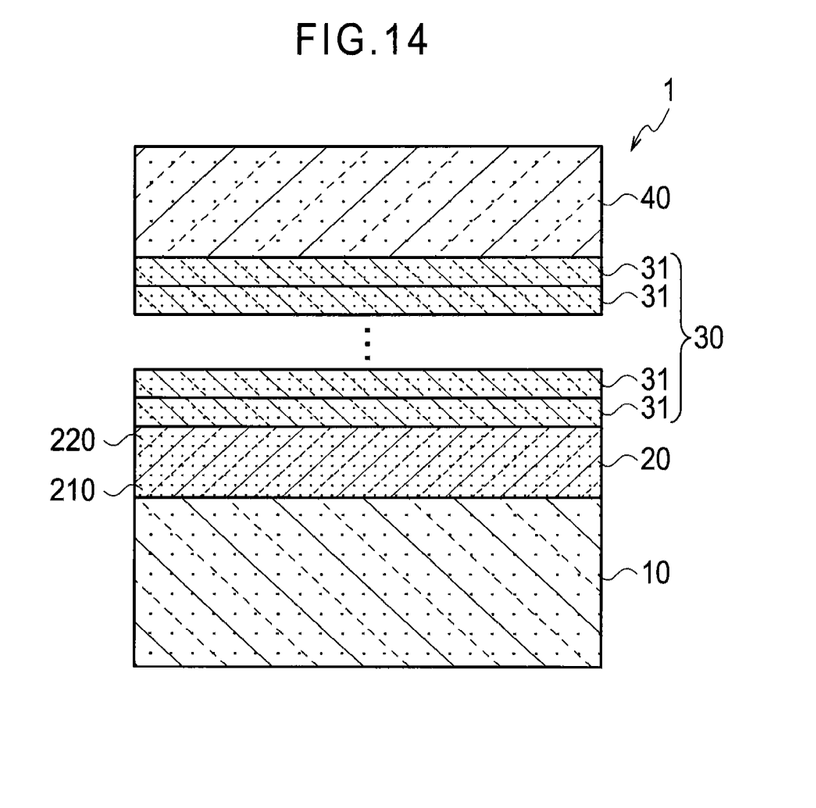
FIG. 14 is a schematic cross-sectional view showing a structure of a semiconductor device according to another modification of the second embodiment of the present invention.
Figure 15:
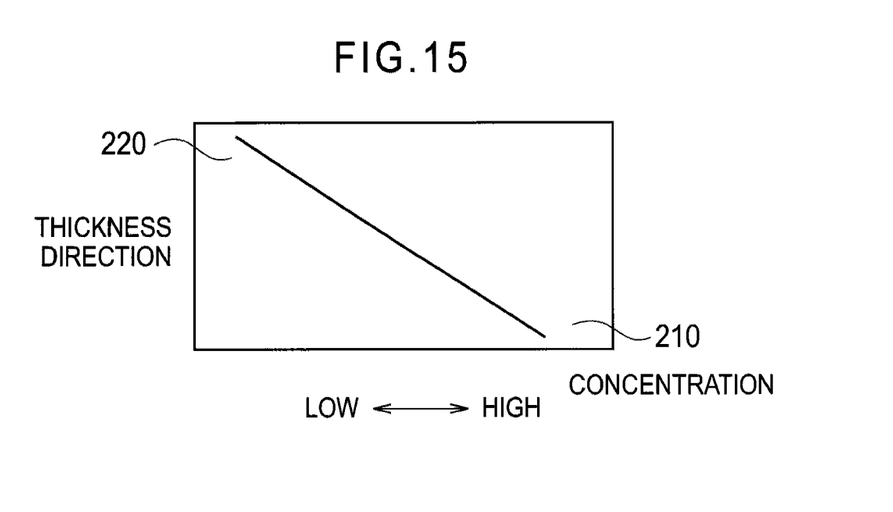
FIG. 15 is a graph showing an impurity concentration in an aluminum nitride layer of the semiconductor device shown in FIG. 14.
Figure 16:
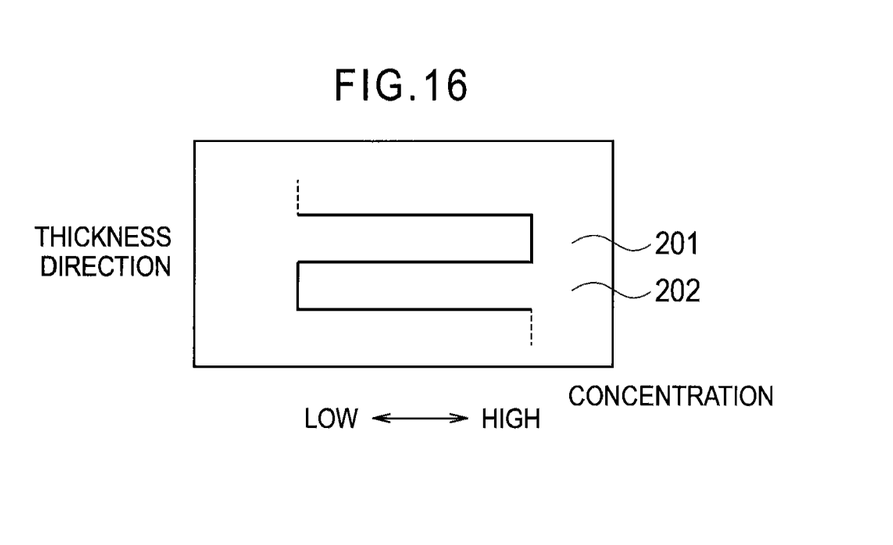
FIG. 16 is a graph showing an impurity concentration in an aluminum nitride layer of the semiconductor device shown in FIG. 9.

As shown in FIG. 15, in the Si-doped AlN layer 20 illustrated in FIG. 14, the Si concentration in the Si-doped AlN layer 20 is changed in slope. On the contrary, the Si concentration of, for example, the Si-doped AlN layer 20 having the structure shown in FIG. 9 is changed like steps as shown in FIG. 16.

As explained above, by performing graded doping by which the Si concentration is continuously changed in the film thickness direction, distortion in the Si-doped AlN layer 20 can be alleviated, thus suppressing occurrence of cracks.

The Si concentration of the Si-doped AlN layer 20 may also be continuously changed in the film thickness direction so that the Si concentration of the region 210 in the vicinity of the silicon substrate 10 is low and the Si concentration of the region 220 in the vicinity of the buffer layer 30 is high.

Through the experiments conducted by the present inventors, the effective way of realizing the semiconductor device 1 having good conductivity and improved crystal quality was that, in the structure where a region in which Si is doped as an impurity (the first AlN region 201) and a non-doped region (the second AlN region 202) are alternately laminated, the thicknesses of such regions are set to be 10 nm or smaller, more preferably 5 nm or smaller. When the thicknesses of the respective regions are 10 nm or smaller, carriers can easily move in the lamination direction due to a tunneling effect, thus improving the conductivity. Therefore, the crystal quality is improved by a reduced Si doped quantity, and, at the same time, a desired conductivity can be obtained. This effect is even more enhanced when each of the regions has a thickness of 5 nm or less.

Further, in this structure, by increasing the Si doped quantity in the direction towards the silicon substrate 10, occurrence of cracks is suppressed, thus acquiring good crystal quality. This is because, three-dimensional growth of the AlN film is facilitated as a doped quantity is increased near the silicon substrate 10, and lateral growth utilizing the three-dimensional growth makes it possible to reduce dislocation density and suppress occurrence of cracks.

Various modifications will become possible for those skilled in the art after receiving the teachings of the present disclosure without departing from the scope thereof.

What is claimed is:

1. A semiconductor device, comprising:
   a silicon substrate;
   an aluminum nitride layer which is arranged on the silicon substrate;
   a buffer layer which is arranged on the aluminum nitride layer and has a structure where a plurality of nitride semiconductor films are laminated; and
   a semiconductor functional layer which is arranged on the buffer layer and made of nitride semiconductor,
   wherein the aluminum nitride layer has a structure where a plurality of first aluminum nitride regions in which silicon is doped and a plurality of second aluminum nitride regions having a silicon concentration lower than that of the first aluminum nitride regions are laminated alternately.

2. The semiconductor device according to claim 1, wherein the first aluminum nitride region is arranged in proximity to the silicon substrate.

3. The semiconductor device according to claim 1, wherein the second aluminum nitride region is arranged in proximity to the silicon substrate.

4. The semiconductor device according to claim 1, wherein a silicon concentration in a region in the aluminum nitride layer having a maximum silicon concentration is $1\times10^{18}$ cm$^{-3}$ or higher but not exceeding $1\times10^{21}$ cm$^{-3}$.

5. The semiconductor device according to claim 1, wherein a film thickness of the aluminum nitride layer is 20 nm or larger but not exceeding 300 nm.

6. The semiconductor device according to claim 1, wherein the buffer layer has a structure in which a multilayered film having a plurality of $Al_xGa_{1-x}N$ ($0<\!/\!=X<\!/\!=1$) films having different compositions from each other and arranged next to each other is laminated cyclically.

7. The semiconductor device according to claim 1, further comprising first and second main electrodes arranged away from each other on the semiconductor functional layer, and the semiconductor functional layer includes a carrier travel layer, and a carrier supply layer having a larger bandgap than the carrier travel layer.

8. The semiconductor device according to claim 1, wherein the silicon doping concentration in the first aluminum nitride regions is $1\times10^{18}$ cm$^{-3}$ or higher but not exceeding $1\times10^{21}$ cm$^{-3}$ and the silicon doping concentration in the second aluminum nitride regions is $1\times10^{17}$ cm$^{-3}$ or lower.

9. The semiconductor device according to claim 1, wherein the silicon doping concentration in the first aluminum nitride regions is $1\times10^{18}$ cm$^{-3}$ or higher but not exceeding $1\times10^{21}$ cm$^{-3}$ and the silicon doping concentration in the second aluminum nitride regions is $1\times10^{19}$ cm$^{-3}$ or lower.

10. The semiconductor device according to claim 1, wherein the silicon doping concentration in the first aluminum nitride regions is $1\times10^{18}$ cm$^{-3}$ or higher but not exceeding $1\times10^{21}$ cm$^{-3}$ and the second aluminum nitride regions are not doped with silicon.

11. A semiconductor device, comprising:
    a silicon substrate;
    an aluminum nitride layer which is arranged on the silicon substrate and has a region where silicon is doped thereof as an impurity;
    a buffer layer which is arranged on the aluminum nitride layer and has a structure where a plurality of nitride semiconductor films are laminated; and
    a semiconductor functional layer which is arranged on the buffer layer and made of nitride semiconductor,
    wherein a silicon concentration in the aluminum nitride layer changes continuously in a film thickness direction.

12. The semiconductor device according to claim 11, wherein a silicon concentration in the aluminum nitride layer changes gradually so that the silicon concentration is high in a region in proximity to the silicon substrate and is low in a region in proximity to the buffer layer.

13. The semiconductor device according to claim 11, wherein a silicon concentration in a region in the aluminum nitride layer having a maximum silicon concentration is $1\times10^{18}$ cm$^{-3}$ or higher but not exceeding $1\times10^{21}$ cm$^{-3}$.

14. The semiconductor device according to claim 11, wherein a film thickness of the aluminum nitride layer is 20 nm or larger but not exceeding 300 nm.

15. The semiconductor device according to claim 11, wherein the buffer layer has a structure in which a multilayered film having a plurality of $Al_xGa_{1-x}N$ ($0<\!/\!=X<\!/\!=1$) films having different compositions from each other and arranged next to each other is laminated cyclically.

16. The semiconductor device according to claim 11, further comprising first and second main electrodes arranged away from each other on the semiconductor functional layer, and the semiconductor functional layer includes a carrier travel layer, and a carrier supply layer having a larger bandgap than the carrier travel layer.

* * * * *